(12) United States Patent
Cartagena

(10) Patent No.: US 6,504,411 B2
(45) Date of Patent: Jan. 7, 2003

(54) REDUNDANT LATCH CIRCUIT AND ASSOCIATED METHODS

(75) Inventor: Eric Noel Cartagena, San Diego, CA (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 10/021,150

(22) Filed: Oct. 30, 2001

(65) Prior Publication Data

US 2002/0095641 A1 Jul. 18, 2002

Related U.S. Application Data

(60) Provisional application No. 60/245,333, filed on Nov. 2, 2000.

(51) Int. Cl.[7] .............................................. H03K 3/037
(52) U.S. Cl. ........................ 327/199; 327/217; 327/526
(58) Field of Search ................................ 327/158–203, 327/215, 216, 217, 219, 225, 526; 326/10–12

(56) References Cited

U.S. PATENT DOCUMENTS

| | | | | |
|---|---|---|---|---|
| 4,334,157 A | * | 6/1982 | Ferris | 327/218 |
| 5,196,734 A | | 3/1993 | Han | 327/195 |
| 5,307,142 A | | 4/1994 | Corbett et al. | 365/156 |
| 5,311,070 A | | 5/1994 | Dooley | 327/208 |
| 5,903,717 A | | 5/1999 | Wardrop | 395/182.1 |
| 5,912,579 A | * | 6/1999 | Zagar et al. | 327/526 |
| 5,923,830 A | | 7/1999 | Fuchs et al. | 395/182.09 |
| 6,098,929 A | | 8/2000 | Falbel | 244/171 |
| 6,127,864 A | * | 10/2000 | Mavis et al. | 327/144 |
| 6,141,770 A | | 10/2000 | Fuchs et al. | 714/11 |
| 6,181,120 B1 | | 1/2001 | Hawkes et al. | 323/282 |
| 6,252,433 B1 | | 6/2001 | Stecklein | 327/65 |
| 6,275,080 B1 | | 8/2001 | Phan et al. | 327/200 |
| 6,282,140 B1 | | 8/2001 | Phan et al. | 365/230.02 |

* cited by examiner

Primary Examiner—Terry D. Cunningham
Assistant Examiner—Long Nguyen
(74) Attorney, Agent, or Firm—Allen, Dyer, Doppelt, Milbrath & Gilchrist, P.A.

(57) ABSTRACT

A redundant latch circuit resistant to SEUs includes a plurality of latches, a majority voting circuit having inputs connected to the latch outputs, and a feedback reset circuit connected to the latch outputs and driving the latch reset inputs. The majority voting circuit indicates a set state for the redundant latch circuit based upon a majority of the latches being in the set state and indicating a reset state otherwise. The feedback reset circuit may have inputs connected to the outputs of the latches, and outputs connected to the reset inputs of the latches. The feedback reset circuit may switch at least one latch back to the reset state, from an SEU-induced change to the set state, when at least one other latch remains in the reset state to thereby provide resistance to SEUs.

31 Claims, 2 Drawing Sheets

REDUNDANT LATCH CIRCUIT AND ASSOCIATED METHODS

RELATED APPLICATION

This application is based upon prior filed copending provisional application Ser. No. 60/245,333 filed Nov. 2, 2000, the entire subject matter of which is incorporated herein by reference in its entirety.

FIELD OF THE INVENTION

The present invention relates to the field of electronic circuits, and, more particularly, to latch circuits resistant to single event upset (SEU) such as caused by energetic heavy ions.

BACKGROUND OF THE INVENTION

Natural or man-made radiation on earth and cosmic rays in space may cause errors in semiconductor devices. When a high energy particle strikes a semiconductor device, it may deposit a charge which can create various effects. For example, where a digital value is stored, as in a memory or a latch, the upset may cause the value stored to change from a one to a zero or vice-versa. A disruption to such a single bit is generally termed a single event upset (SEU). Of course, the upset rate of a semiconductor device can vary based upon the specific structure, size, operating voltage, etc.

Attempts have been made to address the potential disruptions caused by an SEU. For example, U.S. Pat. No. 5,903,717 to Wardrop describes an approach in a fault tolerant computer system using redundant voting at the hardware clock level to detect and correct SEUs. U.S. Pat. No. 5,307,142 to Corbett et al. discloses an asymmetric latch including cross-coupled inverters having a hardened logic state and a soft state. The logic state of the first inverter can only be changed when the voltage on a coupling node is low, and the logic state of the second inverter can only be changed with the coupling node of the inverter is high. One or more such latches can be configured into a memory cell.

U.S. Pat. No. 5,311,070 to Dooley discloses an SEU resistant latch circuit for a gate array standard cell, for example. The latch circuit includes a first latch comprising cross-coupled inverters. Cross-coupled with the first latch is a second latch also having cross-coupled inverters. Respective input nodes of the first and second latches are selectively coupled with the gates of pairs of decoupling transistors so as to bias the gates of the decoupling transistors at predetermined voltage levels. U.S. Pat. No. 6,275,080 B1 to Phan et al. discloses a similar latch circuit with two latches and corresponding isolation transistors.

Along these lines U.S. Pat. No. 6,127,864 to Mavis et al. discloses a temporally redundant latch which redundantly samples data using three sampling circuits which sample the logic data output at three different and distinct sampling times. A sample release circuit selects and outputs a majority of the samples at a fourth time period.

One particularly useful application of an SEU immune or resistant latch circuit is for spaceborne DC-to-DC converter applications. A typical DC-to-DC converter uses one or more latches to control a pulse width modulator. The pulse width modulator, in turn, drives one or more power output devices. The switching rates needed for the pulse width modulator latches may be on the order of several hundred kilohertz. One SEU or a series thereof may cause the converter to suffer a lowered efficiency, or possibly enter an unstable condition resulting in damage or failure.

SUMMARY OF THE INVENTION

In view of the foregoing background, it is therefore an object of the present invention to provide an SEU resistant latch circuit and associated methods, such as may be advantageously used in a pulse width modulation converter circuit, for example.

This and other objects, features and advantages in accordance with the present invention are provided by a redundant latch circuit comprising a plurality of latches, a majority voting circuit having inputs connected to the latch outputs, and a feedback reset circuit connected to the latch outputs and driving the latch reset inputs. More particularly, each latch may have a set input for receiving a respective redundant set signal, a reset input for receiving a respective redundant reset signal, and an output indicating a set or reset state of the respective latch. The majority voting circuit may have inputs connected to the outputs of the latches, and an output indicating a set state for the redundant latch circuit based upon a majority of the latches being in the set state and indicating a reset state otherwise. In addition, the feedback reset circuit may have inputs connected to the latch outputs, and outputs connected to the reset inputs of the latches. The feedback reset circuit may switch at least one latch back to the reset state, from an SEU-induced change to the set state, when at least one other latch remains in the reset state. Accordingly, the redundant latch circuit enjoys resistance to SEUs.

The feedback reset circuit may also have inputs for receiving the redundant reset signals for the latch circuit. The feedback reset circuit may also drive the reset inputs of the individual latches so that the latches switch to the reset state also based upon the redundant reset signals.

The feedback reset circuit may include an EXCLUSIVE OR logic gate having inputs connected to the latch outputs and having an output. A respective reset logic circuit may be connected between the output of the EXCLUSIVE OR logic gate and the reset input of each latch. Each reset logic circuit may include an OR logic gate having inputs connected to the output of the EXCLUSIVE OR gate and receiving a respective redundant reset signal. Each reset logic circuit may also include an INVERTER logic gate having an input receiving a respective redundant set signal, and an AND logic gate having inputs connected to the outputs of the OR logic gate and the INVERTER logic gate. The output of the AND logic gate may be connected to the reset input of a respective latch.

The majority vote circuit may be provided by at least one AND logic gate. The plurality of redundant latches may be as few as two in number.

The redundant latch circuit is especially advantageously used in a power converter, such as a DC-to-DC power converter, for spaceborne applications, for example. The converter may include at least one power switch, and a pulse width modulator. The pulse width modulator may include a drive circuit generating redundant set and reset signals, and a redundant latch circuit as described above connected between the drive circuit and the power switch.

Another aspect of the invention relates to a method for providing resistance to SEUs in a redundant latch circuit of a type comprising a plurality of latches. Each latch may have a set input for receiving a respective redundant set signal, a reset input for receiving a respective redundant reset signal, and an output indicating a set or reset state of a respective latch. The method preferably comprises performing majority voting on the outputs of the latches, and receiving as feedback signals the outputs of the latches to drive the reset inputs of the latches for switching at least one latch back to the reset state, from an SEU-induced change to the set state, when at least one other latch remains in the reset state to thereby provide resistance to SEUs. The majority voting may generate an output indicating a set state for the redundant latch circuit based upon a majority of the latches being in the set state and indicating a reset state otherwise.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in an alternate embodiment.

Figure 1:
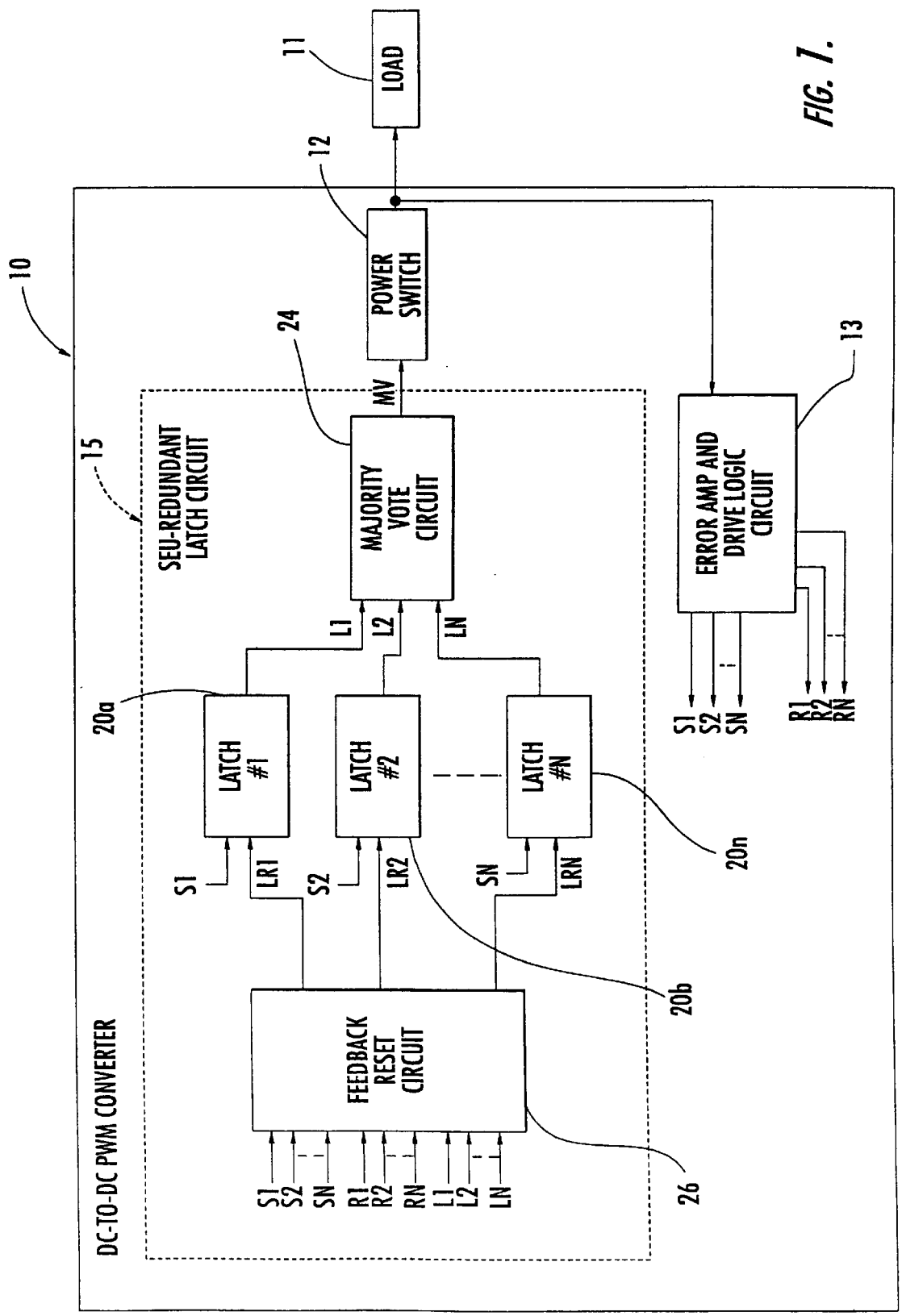
FIG. 1 is a schematic block diagram of a power converter including the SEU resistant redundant latch circuit in accordance with the present invention.

Referring initially to FIG. 1, a DC-to-DC power converter 10 including the redundant latch circuit 15 in accordance with the invention is now described. The DC-to-DC power converter 10 illustratively drives a load 11 based upon the switching operation of one or more power switches 12 as will be readily understood by those skilled in the art. The power switch 12 may be driven by the illustrated pulse width modulator including an error amplifier and associated drive logic circuit 13, or, more simply the drive circuit, and a redundant latch circuit 15 connected between the drive circuit and the power switch. In the illustrated embodiment, this drive circuit 13 generates the redundant set signals S1-SN and redundant reset signals R1–RN which are used by the redundant latch circuit 15.

The redundant set signals S1–SN may be clock signals, for example. The redundant reset signals R1–RN may be generated by a comparator, not shown, supplied with a sawtooth voltage ramp and error signal as will be appreciated by those skilled in the art. A conventional, non-redundant, DC-to-DC converter is disclosed, for example, in U.S. Pat. No. 6,181,120 B1 to Hawkes et al., assigned to the assignee of the present invention, and the entire contents of which are incorporated herein by reference.

The DC-to-DC converter 10 may be vulnerable to SEUs especially in spaceborne applications, for example. The converter 10 may suffer a loss in efficiency, or in a worst case, suffer failure. The redundant latch circuit 15 provides resistance or immunity to SEUs. Although the redundant latch circuit is advantageously used in a DC-to-DC power converter, it may be used in other converter devices, and may be used in many other types of electronic circuits, as will be appreciated by those skilled in the art.

The redundant latch circuit 15 illustratively includes N latches 20a–20n. The redundant latch circuit 15 also includes a majority voting circuit 24 20 having inputs connected to the latch outputs to receive the latch outputs signals L1–LN. The redundant latch circuit 15 also includes a feedback reset circuit 26 connected to the latch outputs and generating latch reset signals LR1–LRN which, in turn, are illustratively coupled to the reset inputs of the latches 20a–20n. The latches 20a–20n have set inputs which receive respective redundant set signals S1–SN. The latches 20a–20n also have reset inputs for receiving redundant reset signals LR1–LRN from the upstream feedback reset circuit 26. Of course, the latches 20a, 20n also have latch outputs which generate latch output signals L1–LN. The latch output signals L1–LN indicate the state of the respective latches, that is, whether the latches are in the set state or the reset state as will be appreciated by those skilled in the art.

The majority voting circuit 24 illustratively has an output MV connected to the power switch 12, although those of skill in the art will recognize that the redundant latch circuit 15 may be connected in many different circuits and for many different applications, as well. The output MV of the majority voting circuit 24 indicates a set state for the overall redundant latch circuit 15 based upon a majority of latch output signals L1–LN being in the set state, and indicates a reset state otherwise.

The feedback reset circuit 26 illustratively includes inputs connected to the latch output to thus use the latch output signals L1–LN as feedback to control resetting of one or more latches that may be switched to an SEU-induced set state from the desired reset state. More particularly, the feedback reset circuit 26 also illustratively has outputs connected to the reset inputs of the latches 20a–20n for delivering the reset signals LR1–LRN.

Should the latches 20a–20n all be in the reset state, and an SEU cause one of the redundant set signals to go high in error, that latch would switch to the set state, but the erroneous output of that latch would not cause the overall output MV of the redundant latch circuit 15 to change. This is so because of the operation of the majority voting circuit 24. One or more subsequent SEUs could cause the other latches to erroneously change states thereby resulting in improper switching of the output. The feedback reset circuit 26 overcomes this potential difficulty.

The feedback reset circuit 26 also includes inputs for receiving redundant reset signals R1–RN. In the illustrated embodiment of the DC-to-DC converter 10 these reset signals R1–RN are generated by the error amplifier and drive logic circuit 13 and would be typically based upon maintaining a desired voltage supplied to the load 11. Of course, these redundant reset signals R1–RN could be generated by other circuitry as contemplated by the present invention. As will also be appreciated by those skilled in the art, the feedback reset circuit 26 also drives the reset inputs of the latches 20–20n with the latch reset signals LR1–LRN also based upon the redundant reset signals R1–RN.

Figure 2:
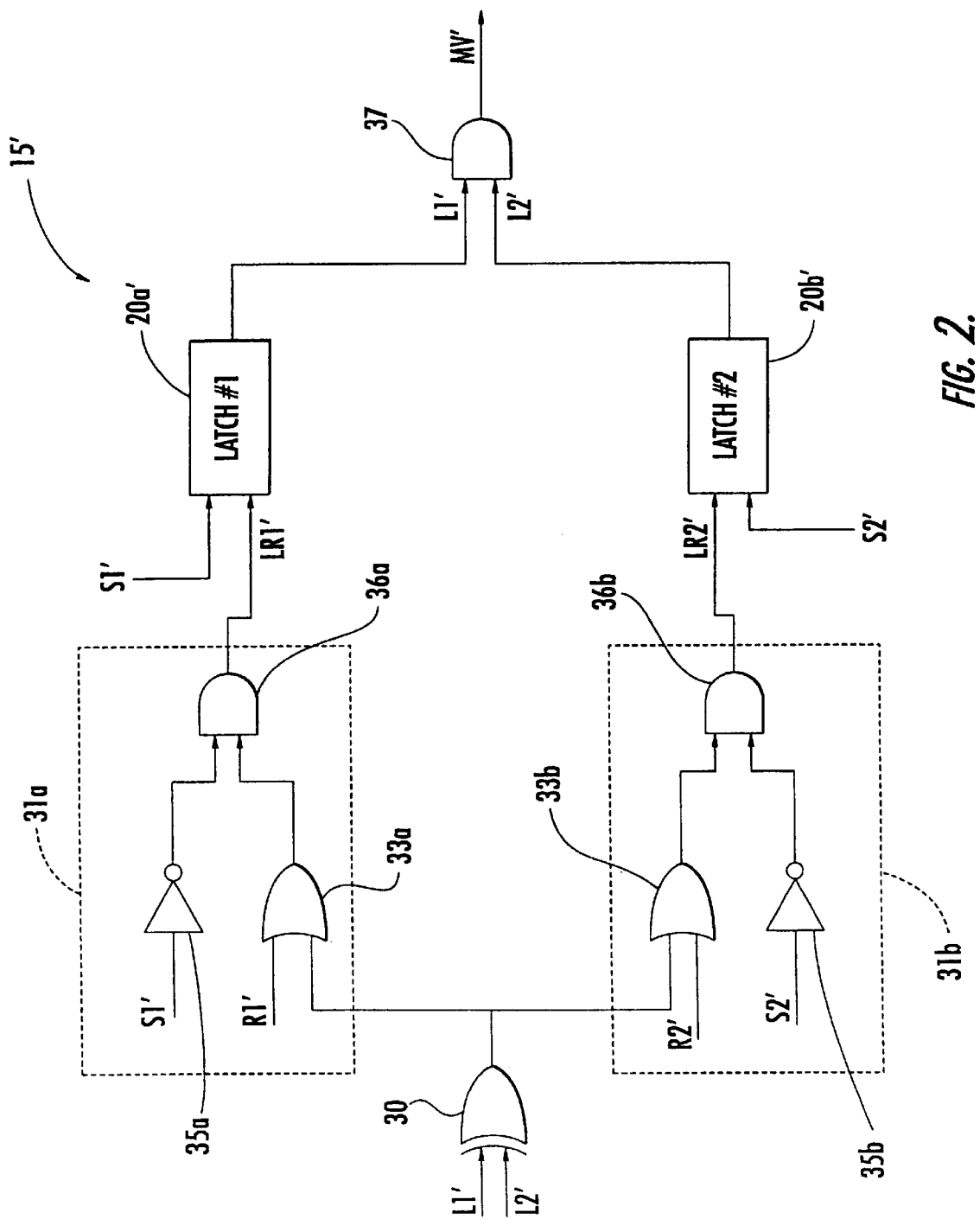
FIG. 2 is a more detailed logic diagram of another embodiment of an SEU redundant latch circuit in accordance with the present invention.

It will be appreciated by those skilled in the art that the redundant latch circuit 15 efficiently implements resistance to SEUs, and has many useful applications in larger electronic circuits, for example. Turning now to the more detailed logic circuit diagram of FIG. 2, a preferred embodiment of the redundant latch circuit 15' is now described, and wherein only two latches 20a', 20b' are shown for clarity of explanation.

In the illustrated embodiment, the feedback reset circuit 31a, 31b illustratively includes an EXCLUSIVE OR logic gate 30 having inputs connected to the latch outputs to receive the latch output signals L1', L2'. A respective reset logic circuit 31a, 31b is illustratively connected between the output of the EXCLUSIVE OR logic gate 30 and the respective latch reset inputs to deliver the respective latch reset signals LR1', LR2' to each latch 20a', 20b'.

Considering now only the upper reset logic circuit 31a for clarity of explanation, the reset circuit generates a high latch reset signal LR1' based upon the redundant reset signal R1' and the output of the EXCLUSIVE OR gate 30 being at a high logic value, and while the redundant set signal S1' is at a low logic value. The reset logic circuit 31a includes an OR logic gate 33a which has an input connected to the output of the EXCLUSIVE OR gate 30 and an input receiving the corresponding redundant reset signal R1'. The reset logic circuit 31a also includes an INVERTER logic gate 35a having an input receiving the respective redundant set signal S1'. The logic reset circuit 31a also illustratively comprises an AND logic gate 36a having inputs connected to the outputs of the OR logic gate 33a and the INVERTER logic gate 35a. The output of the AND logic gate 36a is connected to the reset input of the respective latch 20a to deliver the latch reset signal LR1' thereto.

The lower reset logic circuit 31b is similar and its gates are designated with "b's" instead of "a's" as for the reset circuit 31a. Accordingly, the operation of the lower reset logic circuit 31b needs no further discussion.

In the illustrated embodiment, the majority voting circuit is provided by an AND logic gate 37 having inputs connected to the latch outputs L1', L2'. The output of the AND logic gate 37 defines the majority voting output MV' of the redundant latch circuit 15' as will be appreciated by those skilled in the art.

Considering now the normal operation of the redundant latch circuit 15', it can be seen that when the redundant set signals S1'–S2' are both low, and the reset signals R1', R2' are both low, the output MV' of the AND logic gate 37 will be low. Conversely, when both set signals S1', S2' are high, and both reset signals R1', R2' are low, the output MV' of the AND logic gate 37 will also be low.

Consider now operation during an SEU which causes an error on the first redundant set signal S1' so that it becomes high, while the redundant reset signals R1', R2' are high and the other redundant set signal S2' is low. In this instance, the AND logic gate 37 will properly hold the output MV' at the low logic value. Moreover, the reset circuit 31a and the EXCLUSIVE OR gate 30 will cause a latch reset signal LR1' to be delivered on the reset input of the first latch 20a' thereby driving the latch back to the reset state with a low logic output value. The same reset function would be performed in the event of a similar SEU on the second latch 20b' as will be appreciated by those skilled in the art. Accordingly, the erroneously set latch 20a' in this example is promptly reset so that any subsequent SEU affecting the other latch will not cause the output MV' to switch in error.

Another aspect of the invention relates to a method for providing resistance to SEUs in a redundant latch circuit 15, 15' of a type comprising a plurality of latches 20a–20n; 20a'–20b', and wherein reference numerals are to each embodiment described above. Each latch 20a–20n; 20a'–20b' has a set input for receiving a respective redundant set signal S1–SN; S1'–S2', a reset input for receiving a respective redundant reset signal R1–Rn; R1–R2', and an output indicating a set or reset state of a respective latch. The method preferably comprises performing majority voting on the outputs L1–LN; L1'–L2' of the latches 20a–20n; 20a–20b', and receiving as feedback signals the outputs of the latches to drive the reset inputs LR1–LRN; LR1'–LR2' of the latches for switching at least one latch back to the reset state, from an SEU-induced change to the set state, when at least one other latch remains in the reset state to thereby provide resistance to SEUs. The majority voting may generate an output MV; MV' indicating a set state for the redundant latch circuit 15; 15' based upon a majority of the latches being in the set state and indicating a reset state otherwise. In this case (more than two latches) the voter would not be a simple AND gate but would include logic circuitry readily appreciated by those skilled in the art.

Those of skill in the art will recognize other equivalent combinations of logic gates and circuitry performing the functions detailed above and as contemplated by the present invention. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. A redundant latch circuit resistant to single event upsets (SEUs) and comprising:
    a plurality of latches, each latch having a set input for receiving a respective redundant set signal, a reset input for receiving a respective redundant reset signal, and an output indicating a set or reset state of a respective latch;
    a majority voting circuit having inputs connected to the outputs of said latches, and an output indicating a set state for the redundant latch circuit based upon a majority of said latches being in the set state and indicating a reset state otherwise; and
    a feedback reset circuit having inputs connected to the outputs of said latches, and outputs connected to the reset inputs of said latches for switching at least one latch back to the reset state from an SEU-induced change to the set state when at least one other latch remains in the reset state to thereby provide resistance to SEUs.

2. A redundant latch circuit according to claim 1 wherein said feedback reset circuit also has inputs for receiving the redundant reset signals; and wherein said feedback reset circuit also switches said latches to the reset state based upon the redundant reset signals.

3. A redundant latch circuit according to claim 2 wherein said feedback reset circuit comprises an EXCLUSIVE OR logic gate having inputs connected to the outputs of said latches, and having an output.

4. A redundant latch circuit according to claim 3 wherein said feedback reset circuit further comprises a plurality of reset logic circuits connected between the output of said EXCLUSIVE OR logic gate and respective reset inputs of said latches.

5. A redundant latch circuit according to claim 4 wherein each reset logic circuit comprises:
    an OR logic gate having an input connected to the output of said EXCLUSIVE OR gate, an input receiving a respective redundant reset signal, and an output;
    an INVERTER logic gate having an input receiving a respective redundant set signal, and having an output; and
    an AND logic gate having inputs connected to the outputs of said OR logic gate and said INVERTER logic gate, and having an output connected to the reset input of a respective latch.

6. A redundant latch circuit according to claim 1 wherein said majority vote circuit comprises at least one AND logic gate.

7. A redundant latch circuit according to claim 1 wherein said feedback reset circuit comprises an EXCLUSIVE OR logic gate having inputs connected to the outputs of said latches.

8. A redundant latch circuit according to claim 1 wherein said majority vote circuit comprises an AND logic gate; and wherein said feedback reset circuit comprises an EXCLUSIVE OR logic gate having inputs connected to the outputs of said latches.

9. A redundant latch circuit according to claim 1 wherein said plurality of latches are two in number.

10. A redundant latch circuit resistant to single event upsets (SEUs) and comprising:
   a plurality of latches, each latch having a set input for receiving a respective redundant set signal, a reset input for receiving a respective redundant reset signal, and an output indicating a set or reset state of a respective latch;
   at least one AND logic gate having inputs connected to the outputs of said latches, and an output indicating a set state or reset state for the redundant latch circuit; and
   a feedback reset circuit having inputs connected to the outputs of said latches, inputs for receiving the redundant reset signals, and outputs connected to the reset inputs of said latches for switching said latches to the reset state based upon the redundant reset signals and for switching at least one latch back to the reset state from an SEU-induced change to the set state when at least one other latch remains in the reset state to thereby provide resistance to SEUs.

11. A redundant latch circuit according to claim 10 wherein said feedback reset circuit comprises an EXCLUSIVE OR logic gate having inputs connected to the outputs of said latches, and having an output.

12. A redundant latch circuit according to claim 11 wherein said feedback reset circuit further comprises a plurality of reset logic circuits connected between the output of said EXCLUSIVE OR logic gate and respective reset inputs of said latches.

13. A redundant latch circuit according to claim 12 wherein each reset logic circuit comprises:
   an OR logic gate having an input connected to the output of said EXCLUSIVE OR gate, an input receiving a respective redundant reset signal, and an output;
   an INVERTER logic gate having an input receiving a respective redundant set signal, and having an output; and
   an AND logic gate having inputs connected to the outputs of said OR logic gate and said INVERTER logic gate, and having an output connected to the reset input of a respective latch.

14. A redundant latch circuit according to claim 10 wherein said plurality of latches are two in number.

15. A redundant latch circuit resistant to single event upsets (SEUs) and comprising:
   a plurality of latches, each latch having a set input for receiving a respective redundant set signal, a reset input for receiving a respective redundant reset signal, and an output indicating a set or reset state of a respective latch;
   a majority voting circuit having inputs connected to the outputs of said latches, and an output indicating a set state for the redundant latch circuit based upon a majority of said latches being in the set state and indicating a reset state otherwise; and
   a feedback reset circuit comprising an EXCLUSIVE OR logic gate having inputs connected to the outputs of said latches, said feedback reset circuit also having inputs for receiving the redundant reset signals and outputs connected to the reset inputs of said latches for switching said latches to the reset state based upon the redundant reset signals and for switching at least one latch back to the reset state from an SEU-induced change to the set state when at least one other latch remains in the reset state to thereby provide resistance to SEUs.

16. A redundant latch circuit according to claim 15 wherein said feedback reset circuit further comprises a plurality of reset logic circuits connected between the output of said EXCLUSIVE OR logic gate and respective reset inputs of said latches.

17. A redundant latch circuit according to claim 16 wherein each reset logic circuit comprises:
   an OR logic gate having an input connected to the output of said EXCLUSIVE OR gate, an input receiving a respective redundant reset signal, and an output;
   an INVERTER logic gate having an input receiving a respective redundant set signal, and having an output; and
   an AND logic gate having inputs connected to the outputs of said OR logic gate and said INVERTER logic gate, and having an output connected to the reset input of a respective latch.

18. A redundant latch circuit according to claim 15 wherein said majority vote circuit comprises at least one AND logic gate.

19. A redundant latch circuit according to claim 15 wherein said plurality of latches are two in number.

20. A power converter comprising:
   at least one power switch; and
   a pulse width modulator comprising a drive circuit generating redundant set and reset signals, and a redundant latch circuit connected between said drive circuit and said at least one power switch, said redundant latch circuit comprising
      a plurality of latches, each latch having a set input for receiving a respective redundant set signal, a reset input for receiving a respective redundant reset signal, and an output indicating a set or reset state of a respective latch,
      a majority voting circuit having inputs connected to the outputs of said latches, and an output indicating a set state for the redundant latch circuit based upon a majority of said latches being in the set state and indicating a reset state otherwise, and
      a feedback reset circuit having inputs connected to the outputs of said latches, and outputs connected to the reset inputs of said latches for switching at least one latch back to the reset state from an SEU-induced change to the set state when at least one other latch remains in the reset state to thereby provide resistance to SEUs.

21. A power converter according to claim 20 wherein said feedback reset circuit also has inputs for receiving the redundant reset signals; and wherein said feedback reset circuit also switches said latches to the reset state based upon the redundant reset signals.

22. A power converter according to claim 21 wherein said feedback reset circuit comprises an EXCLUSIVE OR logic gate having inputs connected to the outputs of said latches, and having an output.

23. A power converter according to claim 22 wherein said feedback reset circuit further comprises a plurality of reset logic circuits connected between the output of said EXCLUSIVE OR logic gate and respective reset inputs of said latches.

24. A power converter according to claim 23 wherein each reset logic circuit comprises:
   an OR logic gate having an input connected to the output of said EXCLUSIVE OR gate, an input receiving a respective redundant reset signal, and an output;
   an INVERTER logic gate having an input receiving a respective redundant set signal, and having an output; and
   an AND logic gate having inputs connected to the outputs of said OR logic gate and said INVERTER logic gate, and having an output connected to the reset input of a respective latch.

25. A power converter according to claim 20 wherein said majority vote circuit comprises at least one AND logic gate.

26. A power converter according to claim 20 wherein said plurality of latches are two in number.

27. A method for providing resistance to single event upsets (SEUs) in a redundant latch circuit comprising a plurality of latches each having a set input for receiving a respective redundant set signal, a reset input for receiving a respective redundant reset signal, and an output indicating a set or reset state of a respective latch, the method comprising:

performing majority voting on the outputs of the latches to generate an output indicating a set state for the redundant latch circuit based upon a majority of the latches being in the set state and indicating a reset state otherwise; and receiving as feedback signals the outputs of the latches to drive the reset inputs of the latches for switching at least one latch back to the reset state from an SEU-induced change to the set state when at least one other latch remains in the reset state to thereby provide resistance to SEUs.

28. A method according to claim 27 further comprising also driving the reset inputs of the latches based upon the redundant reset signals.

29. A method according to claim 27 wherein receiving as feedback signals is performed using an EXCLUSIVE OR logic gate.

30. A method according to claim 27 wherein the majority voting is performed using at least one AND logic gate.

31. A method according to claim 27 wherein the plurality of redundant latches are two in number.

* * * * *